(12) United States Patent
Bancken et al.

(10) Patent No.: US 8,217,558 B2
(45) Date of Patent: Jul. 10, 2012

(54) APPARATUS FOR REGULATING THE TEMPERATURE OF A LIGHT EMITTING DIODE

(75) Inventors: Pascal Bancken, Opwijk (BE); Viet Nguyen Hoang, Leuven (BE); Radu Surdeanu, Roosbeek (BE); Benoit Bataillou, Lyons (FR); David van Steenwinckel, Holsbeek (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/910,583

(22) Filed: Oct. 22, 2010

(65) Prior Publication Data

US 2011/0121705 A1 May 26, 2011

(30) Foreign Application Priority Data

Oct. 22, 2009  (EP) .................................... 09173748

(51) Int. Cl.
*H01J 7/24* (2006.01)
*H01L 33/00* (2010.01)

(52) U.S. Cl. .......... 313/46; 313/512; 236/34; 236/101 R
(58) Field of Classification Search .................. None
See application file for complete search history.

(56) References Cited

U.S. PATENT DOCUMENTS

| 5,371,753 | A | 12/1994 | Adsett |
| 6,333,772 | B1 | 12/2001 | Mori et al. |
| 6,534,794 | B1 | 3/2003 | Nakanishi |
| 7,880,372 | B2 * | 2/2011 | Ichikawa et al. ................ 313/51 |
| 2003/0076565 | A1 | 4/2003 | Noda |
| 2003/0133302 | A1 * | 7/2003 | Kamiya et al. ................ 362/345 |

FOREIGN PATENT DOCUMENTS

| EP | 0 852 398 A1 | 7/1998 |
| FR | 2 880 192 A1 | 6/2006 |
| JP | 58 092247 A | 6/1983 |
| JP | 2003 009382 A | 1/2003 |
| JP | 2004 148838 A | 5/2004 |
| JP | 2006 060165 A | 3/2006 |
| JP | 2007 194502 A | 8/2007 |

OTHER PUBLICATIONS

Extended European Search Report for Patent Appln. No. 09173748.6 (May 31, 2010).

* cited by examiner

*Primary Examiner* — Ashok Patel

(57) ABSTRACT

Apparatus for regulating the temperature of a light emitting diode (LED). The apparatus includes a heat sink, an LED mount, and an LED mounted on the LED mount. The LED mount is configured to change shape in response to a change in temperature. The change in shape alters the position of the LED relative to the heat sink, for adjusting heat transfer between the LED and the heat sink. The LED mount may include a laminated portion such as a bi-metallic strip.

18 Claims, 3 Drawing Sheets

APPARATUS FOR REGULATING THE TEMPERATURE OF A LIGHT EMITTING DIODE

This application claims the priority under 35 U.S.C. §119 of European patent application no. 09173748.6, filed on Oct. 22, 2009, the contents of which are incorporated by reference herein.

BACKGROUND OF THE INVENTION

This invention relates to semiconductor devices such as light emitting diodes. In particular, this invention relates to an apparatus for regulating the temperature of a light emitting diode.

The emission spectrum (in terms of both intensity and peak wavelength) of an LED is temperature dependent. In particular, it is the junction temperature of the LED that influences the emission spectrum. To achieve a stable light output from an LED, it is therefore necessary to regulate the temperature of the LED.

Traditionally, the junction temperature in the LED is measured directly or indirectly via a temperature sensor and a model to derive the junction temperature, and the LED is then operated (by adjusting the amplitude, frequency and/or duty cycle of the current passing through the LED) to react to any changes in LED temperature. Arrangements of this kind are complex, and require the provision of a control loop including at least a variable current supply and means for measuring the LED temperature.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided an apparatus for regulating the temperature of a light emitting diode (LED). The apparatus includes a heat sink, an LED mount, and an LED mounted on the LED mount. The LED mount is configured to change shape in response to a change in temperature. The change in shape alters the position of the LED relative to the heat sink, for adjusting heat transfer between the LED and the heat sink.

This invention provides a solution to the problem of LED temperature regulation, which does not require a complex control loop of the kind described above. In accordance with the invention, the mount on which an LED is mounted changes shape (e.g. becomes larger, smaller, longer, shorter etc.) in response to a change in temperature, in order to change the position of the LED in relation to a heat sink. In particular, the changes in position of the LED relative to the heat sink can be used to modulate heat transfer between the heat sink and the LED.

In one example, the change in shape of the mount can alter the position of the LED relative to the heat sink, to bring the LED into physical contact with the heat sink, in response to an increase in temperature. Thus, as the temperature increases, the LED can be put into contact with the heat sink, thereby increasing heat flow from the LED to the heat sink, thereby providing additional cooling power to lower the LED temperature. Conversely, the change in shape of the mount can also alter the position of the LED relative to the heat sink, to break physical contact between the LED and the heat sink in response to a decrease in temperature. The decrease in cooling power caused by the lack of physical contact between the LED and the heat sink can thereby cause an increase in temperature in the LED.

In one embodiment, the LED mount is configured to alter the position of the LED relative to the heat sink, to maintain the temperature of the LED between a maximum temperature and a minimum temperature. By way of example only, physical contact between the LED and the heat sink can be formed as the temperature of the LED approaches or becomes substantially equal to the maximum temperature. Conversely, physical contact between the LED and the heat sink can be broken as the temperature of the LED approaches or becomes substantially equal to said minimum temperature.

Numerous examples of LED mounts that can change shape in response to a change in temperature are described herein. In one such example, at least a portion of the LED mount is configured to undergo thermal expansion and/or thermal contraction in response to a change in temperature, for changing the shape of the LED mount. In another example, the LED mount comprises a laminated portion with at least two layers having different coefficients of thermal expansion. The at least two layers can be arranged to expand and contract at different rates in response to a change in temperature, thereby to cause the LED mount to change shape. The layers may comprise metallic strips having different coefficients of thermal expansion.

In a further example, the LED mount comprises at least one elongate finger on which said LED is mounted. The LED may be mounted substantially at one end of the finger. The finger can be configured to bend in response to a change in temperature, thereby to deflect the LED toward or away from the heat sink in response to said change in temperature.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Figure 1:
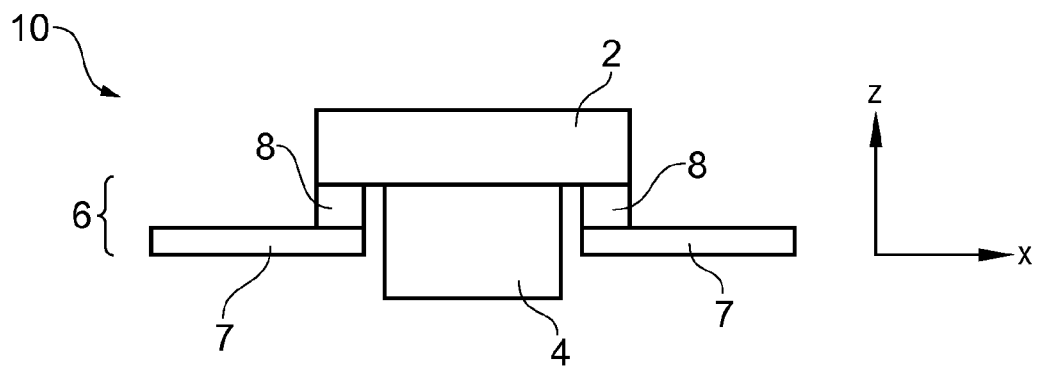
FIG. 1 shows an example of an apparatus comprising an LED mount, an LED, and a heat sink, in accordance with an embodiment of the invention.
Figure 2:
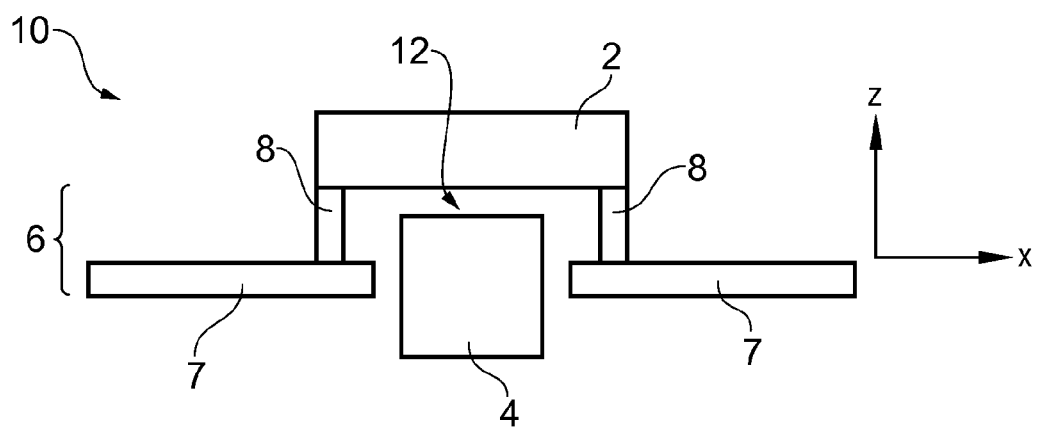
FIG. 2 shows the example apparatus of FIG. 1, following a change of shape of the LED mount.

FIGS. 1 and 2 schematically illustrate a first embodiment of the invention. In accordance with this embodiment, there is provided an LED 2 mounted on an LED mount 6, and a heat sink 4. As shown in FIGS. 1 and 2, the LED mount 6 includes a first portion 7 and a second portion 8. The first portion 7 of the LED mount 6 is generally fixed in position, and may, for example, comprise a part of a printed circuit board (PCB), or another part of the housing of the device into which the LED 2 is incorporated.

The second portion 8 of the LED mount 6 is configured to change shape in response to a change in temperature. This change in shape may, for example, arise from thermal expansion/contraction within the second portion 8. Generally, the change in temperature in the second portion 8 arises from the dissipation of heat from the LED 2 to the second portion 8. Due to thermal conduction between the LED 2 and the second portion 8, the temperature of the second portion 8 will tend to track the temperature of the LED 2. The second portion is shown schematically FIGS. 1 and 2, for the purpose is illustrating how a change in shape in the second portion 8 can be used to regulate the temperature of the LED 2. Examples of particular structures that can be employed to implement the second portion 8 are described hereinafter.

As is illustrated in FIGS. 1 and 2, since the LED 2 is attached to the second portion 8, a change in shape of the second portion 8 changes the position of the LED 2 with respect to the heat sink 4. More particularly, movement of the LED 2 relative to the heat sink 4 can bring the LED 2 into contact with the heat sink 4 (as shown in FIG. 1). Movement of the LED 2 relative to the heat sink can also to break physical contact between the LED 2 and the heat sink 4 (as shown in FIG. 2). When physical contact between the LED 2 and the heat sink 4 is broken as shown in FIG. 2, a gap 12 is opened there between.

While the LED 2 and the heat sink 4 are in physical contact, a good thermal contact exists between the LED 2 and the heat sink 4. Under these conditions, heat may freely flow from the LED 2 to the heat sink 4, whereby the heat sink 4 is able to provide effect cooling power for the LED 2. Conversely, while the gap 12 between the LED 2 and heat sink 4 is exists, there is only a weak thermal contact between the LED 2 and the heat sink 4s. Although a small quantity of heat may still nevertheless bridge the gap 12 between the LED 2 and the heat sink 4, the cooling power provided by the heat sink 4 in this configuration is minimal. Since the LED 2 continually produces heat during operation, when the gap 12 is present the temperature of the LED 2 (and consequently the second portion 8) will tend to increase. However, when the LED 2 is in contact with the heat sink 4, the cooling power of the heat sink 4 will tend to lead to a drop in temperature in the LED 2 (and consequently in the second portion 8 also).

According to the invention therefore, the position of the LED 2 relative to the heat sink 4 can be altered (by a change in shape of the LED mount 6) for adjusting heat transfer between the LED 2 and the heat sink 4. In particular, in this embodiment, as the temperature of the LED 2 decreases, the second portion 8 of the LED mount 6 expands in the z direction to break physical contact between the LED 2 and the heat sink 4, reaching the configuration shown in FIG. 2. As described above, the change in shape of the second portion 8 is prompted by decrease in temperature in the second portion 8, owing to reduced heat dissipation from the relatively cool LED 2. The gap 12 between the LED 2 and the heat sink 4 subsequently reduces thermal flow between the LED 2 and the heat sink 4, whereby the temperature of the LED 2 will tend to increase, in turn increasing heat dissipation to the LED mount 6, increasing the temperature of the second portion 8. In reaction to this increase in temperature, the second portion 8 contracts in the z direction, thereby to reach the configuration shown in FIG. 1. The renewed contact between the LED 2 and the heat sink 4 increases thermal flow from the LED 2 to the heat sink 4 and thereby tends to decrease the temperature of the LED 2.

The cycle described above may repeat itself during normal operation of the LED 2, thereby to regulate the temperature of the LED 2. As described hereinafter, the regulation of the temperature may be carried out within predefined upper and lower temperature limits, and the second portion 8 of the LED mount 6 can be configured to provide appropriate movement of the LED 2 relative to the heat sink 4 to ensure that the temperature of the LED 2 does not step outside those predetermined limits.

Figure 3:
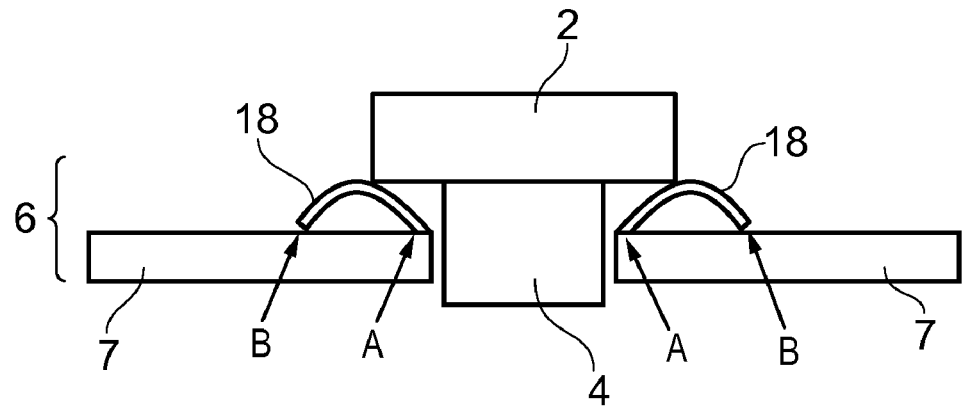
FIG. 3 shows an example of an apparatus comprising an LED mount, an LED, and a heat sink, in accordance with an embodiment of the invention.

A second embodiment of the invention is schematically illustrated in FIGS. 3 and 4. In common with the embodiment described above in relation to FIGS. 1 and 2, the second embodiment includes an LED 2, and a heat sink 4. The LED 2 is mounted on an LED mount 6 which includes a first portion 7 and a second portion 18. As described above in relation to the first embodiment, the second portion 18 of the LED mount 6 is configured to change shape in response to a change in temperature, for altering the position of the LED 2 relative to the heat sink 4, for adjusting heat transferred between the LED 2 and the heat sink 4.

As shown in FIG. 3, the second portions 18 of the LED mount 6 are curved in shape, and in this example take the form of one or more elongate fingers mounted on the first portion 7. In one embodiment, the finger(s) can be provided at regular intervals around the periphery of the LED 2. A first end (labelled A) of each elongate finger is fixed to the first portion 7, while a second end of each elongate finger (labelled B) is free to move, as described in more detail below.

Figure 4A:
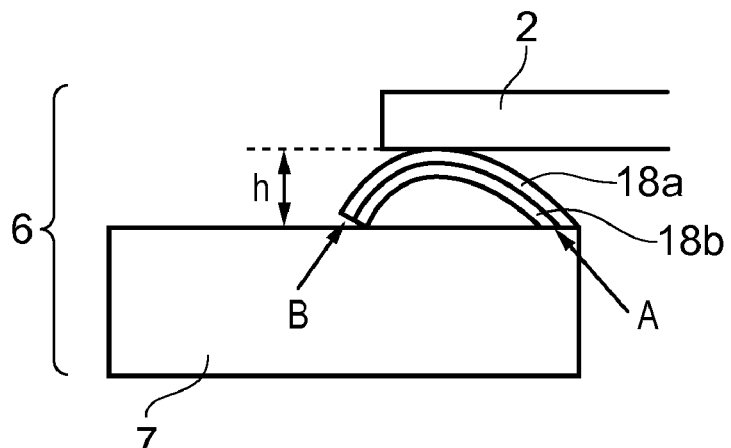
FIGS. 4A and 4B show the LED mount of the apparatus of FIG. 3 in more detail.
Figure 4B:
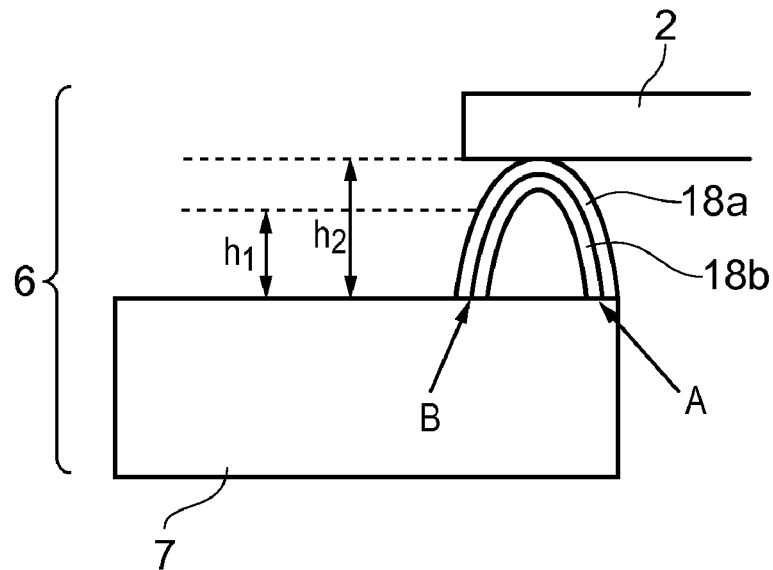

The second portions 18 are shown in more detail in FIGS. 4a and 4b. In particular, the second portion 18 is shown to be laminated in structure, having a first layer 18a and a second layer 18b. The first layer 18a is located above the second layer 18b. The first layer 18a and the second layer 18b have different coefficients of thermal expansion. In particular, the linear coefficient of thermal expansion of the first layer 18a is less than that of the second layer 18b.

Starting with FIG. 4b, the operation of the layers 18a and 18b of the second portion 18 of the LED mount 6 will now be described. In the configuration shown in FIG. 4b, the height of the LED relative to, for example, the first portion 7 of the LED mount 6 is $h_2$ (see FIG. 4b). In this configuration, the LED 2 is typically not in contact with the heat sink 4 (this configuration is therefore analogous with the configuration shown in FIG. 2). Accordingly, in this configuration, heat flow between the LED 2 and the heat sink 4 is restricted, whereby the temperature of the LED 2 will tend to increase. As the temperature of the LED 2 increases, the temperature of the second portion 18 of the LED mount 6 will also tend to increase, by thermal conduction between the LED 2 and the second portion 18, upon which the LED 2 is mounted. In response to this change in temperature of the second portion 18, the first layer 18a and the second layer 18b will tend to expand. However, because the first layer 18a and the second layer 18b have different coefficients of thermal expansion, this will tend to cause a distortion (a change in shape) in the second portion 18. In particular, the second layer 18b will tend to expand to a greater extent than the first layer 18a. This will tend to reduce the curvature of the second portion 18, so that it adopts a straighter configuration, as shown in FIG. 4A. Note that in this example, the change in shape causes the free end B of each elongate finger to move along the surface of the first portion 7. The change in shape also reduces the vertical height of the second portion 18 of the LED mount 6 to $h_1$ as illustrated in FIGS. 4a and 4b. Accordingly, in this example, the second portion expands in the horizontal dimension and contracts in the vertical dimension, in response to an increase in temperature.

This reduction in vertical height of the second portion 18 can cause the LED 2 to resume physical contact with the heat sink 4, thereby enhancing the cooling power of the heat sink or the LED 2 as described above. As the LED 2 cools, the second portion 18 upon which the LED 2 is mounted will also tend to cool owing to a lack of heat transfer from the LED 2. Due to this cooling, the first layer 18a and the second layer 18b of the second portion 18 will tend to contract thermally, thereby to resume the configuration shown in FIG. 4b. Thus, cyclic thermal expansion/contraction of the first layer 18a and the second layer 18b of the second portion 18 of the LED mount 6 can cause the LED 2 to alter position relative to the heat sink, for adjusting heat transfer between the LED 2 and the heat sink 4.

Figure 5:
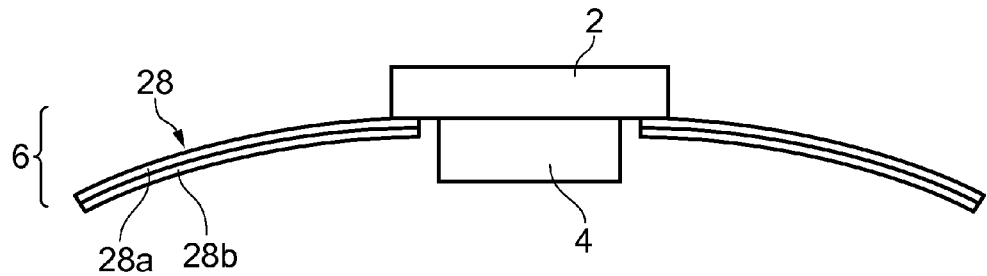
FIG. 5 shows an example of an apparatus comprising an LED mount, an LED, and a heat sink, in accordance with an embodiment of the invention.
Figure 6:
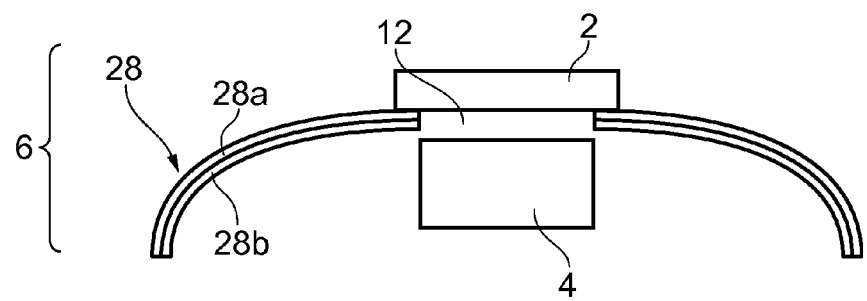
FIG. 6 shows the example apparatus of FIG. 5, following a change of shape of the LED mount.

A third embodiment of the invention is schematically illustrated in FIGS. 5 and 6. As with the first and second embodiments, the LED 2 is mounted on an LED mount 6.

In this embodiment, the LED mount 6 includes a laminated portion 28 comprising a first layer 28a and a second layer 28b. The laminated portion 28 can take the form of one or more elongate fingers, with the LED 2 attached to the tip of each of the fingers. The other end of each of the fingers can be mounted on for example, a PCB or some other structure. In FIGS. 5 and 6, two fingers are provided. In other examples, more fingers (or even just a single finger) may be provided.

The laminated portion 28 is configured to change shape in response to a change in temperature, in order to alter the position of the LED 2 relative to the heat sink 4. More particularly, in this example, the second layer 28b has a linear coefficient of thermal expansion that is greater than that of the first layer 28a. As is illustrated in FIGS. 5 and 6, as the laminated portion 28 increases in temperature, it will therefore tend to straighten out. Conversely, at lower temperatures, the curvature of the laminated portion 28 is increased.

Accordingly, an increase in temperature in the LED 2 causing a corresponding increase in temperature of the laminated portion 28 can in turn cause the laminated portion 28 to adopt a straighter configuration. This brings the LED 2 into contact with the heat sink 4 as shown in FIG. 5. The physical contact between the LED 2 and the heat sink 4 increases the cooling power provided by the heat sink 4 for the LED 2, and the LED 2 will consequently tend to cool. This in turn leads to a cooling of the laminated portion 28, whereby the laminated portion will tend to adopt a more curved configuration as illustrated in FIG. 6. The change in curvature of the laminated portion 28 alters the position of the LED 2 relative to the heat sink 4, such that physical contact is broken, and a gap 12 opens up between the LED 2 and the heat sink 4 (FIG. 6). This reduces the cooling power provided by the heat sink 4, whereby the temperature of the LED 2 will tend to increase.

The cycle described above can, as hereinbefore described, be used to regulate the temperature of the LED 2 between predetermined limits.

The embodiments described in relation to FIGS. 3, 4, 5 and 6 each employ laminated portions such as the layers 18a and 18b and the layers 28a and 28b. These laminated portions may take the form of a bi-metallic strip. Typically, these bimetallic strips may be constructed of two separate metallic materials, with a first material being used for one of the layers and a second material being used for another of the layers. It should be noted however, that the laminated portions are not restricted to comprising only two layers. It is envisaged that more than two layers may also be employed, with a similar effect. Typical materials that may be used in the strips include Iron, Nickel and Copper.

As mentioned above, in accordance with an embodiment of the invention, the change in shape of the LED mount 6 (or at least a portion thereof) can be preconfigured to regulate the temperature of the LED 2 between predetermined temperature limits. This is discussed in more detail below with respect to FIG. 7.

Figure 7:
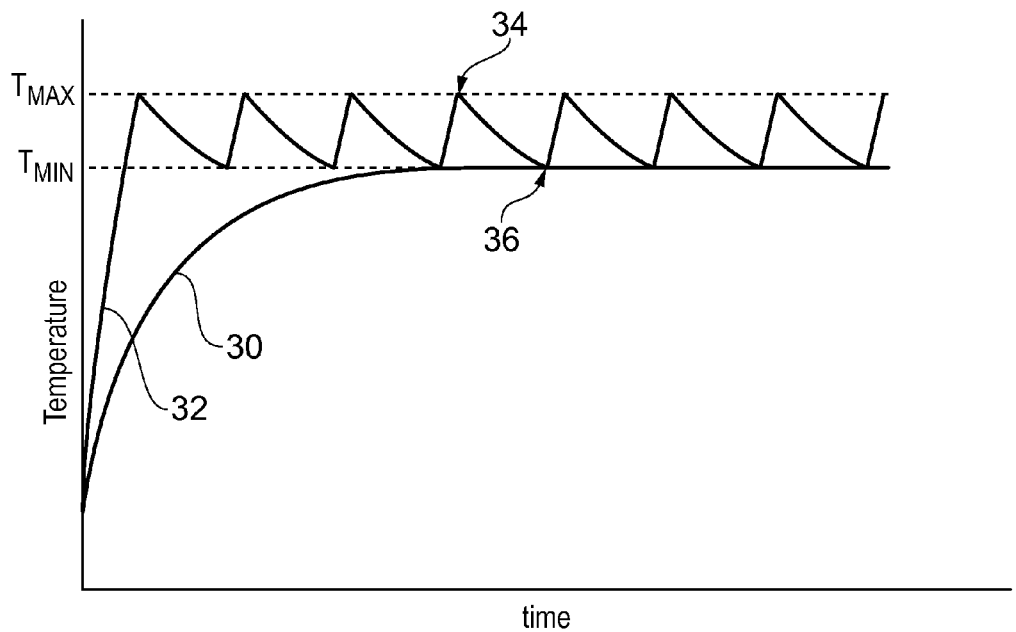
FIG. 7 shows a graph of temperature as a function of time, illustrating temperature regulation of an LED in accordance with an embodiment of the invention.

FIG. 7 illustrates the temperature regulation of an LED in accordance with an embodiment of the invention. The graph of FIG. 7 plots the temperature of the LED as a function of time. The line 30 illustrates the temperature behaviour of an LED which is permanently attached to a heat sink. As can be seen, at T=0, the temperature of the LED begins to ramp up and eventually reaches a plateau. The line 32 illustrates the temperature behaviour of an LED mounted on an LED mount in accordance with an embodiment of this invention, for regulation between a minimum desired temperature $T_{MIN}$ and a maximum temperature $T_{MAX}$.

The temperatures $T_{MIN}$ and $T_{MAX}$ can be chosen to optimise the temperature of the LED for a given output, in terms of intensity and/or wavelength. In FIG. 7, the LED is initially not in contact with the heat sink. Accordingly, and as shown by the line 32, initially, the temperature of the LED ramps up at an increased rate until it reaches temperature $T_{MAX}$. At this point, the increased temperature causes a change in shape of the LED mount, thereby to bring the LED into contact with the heat sink. As illustrated by the line 32, this leads to a drop in temperature in the LED.

In this embodiment, the temperature continues to drop until the temperature $T_{MIN}$ is reached, whereby a change in shape in the LED mount again alters the position of the LED relative to the heat sink, thereby to break physical contact between the LED 2 and the heat sink 4. At this stage, and again as shown by the line 32, the temperature of the LED 2 begins to ramp up again.

As is shown in FIG. 7, the above described cycle can repeat itself indefinitely, with the LED 2 being brought into physical contact and out of physical contact with the heat sink 4, thereby to regulate the temperature of the LED 2 between the predetermined temperatures $T_{MIN}$ and $T_{MAX}$.

It will be appreciated that the change in shape of the LED mount may not be abrupt, and therefore may not take place exactly at the point 34 where the temperature reaches $T_{MAX}$ or at the point 36 where the temperature reaches $T_{MIN}$. Instead, the change in shape may be gradual, continuously to alter the relative position of the LED 2 and the heat sink 4. Moreover, it is envisaged that the making and/or breaking of physical contact may not take place in an abrupt manner, but may also take place in a continuous fashion. For example, the contact surface area of the LED 2 and the heat sink 4 can alter continuously in accordance with a relative change in position between the LED 2 and the heat sink 4. The change in contact surface area between the LED 2 and the heat sink 4 would also lead to a corresponding change in cooling power provided by the heat sink 4 for the LED 2, which would again have a regulatory effect on temperature of the LED 2. Such an embodiment may or may not also involve actual breaking of contact between the LED 2 and the heat sink 4. In such an embodiment, the curve shown in FIG. 7 would not comprise the sharp points 34 and 36, and instead of a saw-tooth line shape, a more rounded, undulating line shape would be observed.

In order to ensure that the change of shape of the LED mount leads to the desired regulation of temperature between $T_{MIN}$ and $T_{MAX}$, it is necessary to select the shape and configuration as well as the materials used in the LED mount. For example, in the case of the laminated portions described in respect of the second and third embodiments above, the length, thickness and/or curvature of the respective layers can be selected. Materials having known coefficients of thermal expansion can also be selected as appropriate, in accordance with the desired amount of distortion that is required.

Accordingly, there has been described an apparatus for regulating the temperature of a light emitting diode (LED). The apparatus includes a heat sink, an LED mount, and an LED mounted on the LED mount. The LED mount is configured to change shape in response to a change in temperature. The change in shape alters the position of the LED relative to the heat sink, for adjusting heat transfer between the LED and the heat sink. The LED mount may include a laminated portion such as a bi-metallic strip.

Although particular embodiments of the invention have been described, it will be appreciated that many modifications/additions and/or substitutions may be made within the scope of the claimed invention.

The invention claimed is:

1. Apparatus for regulating the temperature of a light emitting diode (LED), the apparatus comprising:
a heat sink;
an LED mount; and
an LED mounted on the LED mount,
wherein the LED mount is configured to change shape in response to a change in temperature and comprises at least one elongate finger on which said LED is mounted, wherein said at least one finger is configured to bend in response to a change in temperature, thereby to deflect the LED toward or away from the heat sink in response to said change in temperature,
wherein said change in shape alters the position of the LED relative to the heat sink, for adjusting heat transfer between the LED and the heat sink.

2. The apparatus of claim 1, wherein said change in shape alters the position of the LED relative to the heat sink, to bring the LED into physical contact with the heat sink in response to an increase in temperature.

3. The apparatus of claim 1, wherein said change in shape alters the position of the LED relative to the heat sink, to break physical contact between the LED and the heat sink in response to a decrease in temperature.

4. The apparatus of claim 1, wherein the LED mount is configured to alter the position of the LED relative to the heat sink, to maintain the temperature of the LED between a maximum temperature and a minimum temperature.

5. The apparatus of claim 4, wherein said change in shape alters the position of the LED relative to the heat sink to bring the LED into physical contact with the heat sink when the temperature of the LED approaches or is substantially equal to said maximum temperature.

6. The apparatus of claim 4, wherein said change in shape alters the position of the LED relative to the heat sink to break physical contact between the LED and the heat sink when the temperature of the LED approaches or is substantially equal to said minimum temperature.

7. The apparatus of claim 1, wherein at least a portion of said LED mount is configured to undergo at least one of thermal expansion and thermal contraction in response to said change in temperature, for changing the shape of the LED mount to alter the position of the LED relative to the heat sink.

8. The apparatus of claim 1, wherein the LED mount comprises a laminated portion with at least two layers having different coefficients of thermal expansion, and wherein said at least two layers are arranged to expand and contract at different rates in response to a change in temperature, thereby to cause the LED mount to change shape.

9. The apparatus of claim 8, wherein said at least two layers comprise metallic strips having different coefficients of thermal expansion.

10. The apparatus of claim 1, wherein the LED is mounted substantially at one end of the finger of the LED mount.

11. An apparatus comprising:
a heat sink;
a light-emitting diode (LED); and
a mount connected to the LED and configured and arranged to respond to changes in temperature by deflecting and moving the LED relative to the heat sink to adjust heat transfer between the LED and the heat sink.

12. The apparatus of claim 11, wherein the mount is configured and arranged to contract and expand to move the LED relative to the heat sink while maintaining the orientation of the LED for directing light in a single direction.

13. The apparatus of claim 11, wherein the mount is configured and arranged to
deflect and bring the LED into physical contact with the heat sink in response to an increase in temperature, and
deflect and break physical contact between the LED and the heat sink in response to a decrease in temperature.

14. The apparatus of claim 11, wherein the mount is configured and arranged to deflect and move the LED relative to the heat sink to maintain the temperature of the LED between a maximum temperature and a minimum temperature.

15. The apparatus of claim 11, wherein the mount is configured and arranged to respond to changes in temperature by undergoing thermal expansion and thermal contraction to alter the position of the LED relative to the heat sink.

16. The apparatus of claim 11, wherein the mount includes at least two layers having different coefficients of thermal expansion, the layers being configured and arranged to expand and contract at different rates in response to a change in temperature.

17. The apparatus of claim 11, wherein the mount includes two heat-responsive structures respectively connected to opposite ends of the LED, the heat-responsive structures having a first end connected to a support structure and a second end connected to the LED, the heat sink being between the heat-responsive structures, the heat-responsive structures being configured and arranged to
contract and draw the LED closer to the support structure and the heat sink in response to an increase in temperature; and
expand and push the LED away from the support structure and the heat sink in response to a decrease in temperature.

18. The apparatus of claim 17, wherein the heat-responsive structures are configured and arranged to contract and expand while maintaining the orientation of the LED for directing light in a single direction.

* * * * *